United States Patent [19]

Blondeau et al.

[11] Patent Number: 5,115,283

[45] Date of Patent: May 19, 1992

[54] OPTOELECTRONIC DEVICE ON SEMI-INSULATOR SUBSTRATE AND METHODS FOR MAKING SUCH A DEVICE

[75] Inventors: Robert Blondeau, Ablis; Daniel Rondt, Paris; Geneviève Glastre, Gif Sur Yvette; Michel Krakowski, Bourg La Reine, all of France

[73] Assignee: Thomson-CSF, Puteaux, France

[21] Appl. No.: 530,607

[22] Filed: May 30, 1990

[30] Foreign Application Priority Data

Jun. 6, 1989 [FR] France ............................. 89 07454

[51] Int. Cl.⁵ ...................... H01L 33/00; H01S 3/18; H01S 3/19
[52] U.S. Cl. ....................................... 357/17; 372/45; 372/47
[58] Field of Search ............... 357/17; 372/43, 44, 372/45, 46, 47, 48

[56] References Cited

U.S. PATENT DOCUMENTS 4,277,759  7/1981  Tanaka et al. ................... 372/47
4,635,336 12/1982  Sugino et al. ................... 372/45

FOREIGN PATENT DOCUMENTS 63-31187  2/1988  Japan .
64-7584   1/1989  Japan .

OTHER PUBLICATIONS

Patent Abstracts of Japan, vol. 12, No. 239 (E-630).
Patent Abstracts of Japan, vol. 13, No. 181 (E-750)[3529].
Electronics Letters, vol. 17, No. 1, 8 Jan. 1981, pp. 12–14.

Primary Examiner—Jerome Jackson, Jr.
Attorney, Agent, or Firm—Roland Plottel

[57] ABSTRACT

Disclosed is an optoelectronic device on a semi-insulator substrate, of the type comprising, stacked on one another, at least:
  one substrate made of semi-insulator material,
  one lower confinement layer with a first type of conductivity,
  at least one active layer in strip form, and
  an upper confinement layer with a second type of conductivity. In this device, the lower confinement layer covers one side of the semi-insulator substrate in passing beneath the active layer and coming to a stop substantially vertically to this active layer and the upper confinement layer covers the other side of the semi-insulator substrate in passing over the active layer and coming to a stop substantially vertically to this active layer. The disclosure can be applied notably to the fabrication of lasers.

6 Claims, 5 Drawing Sheets

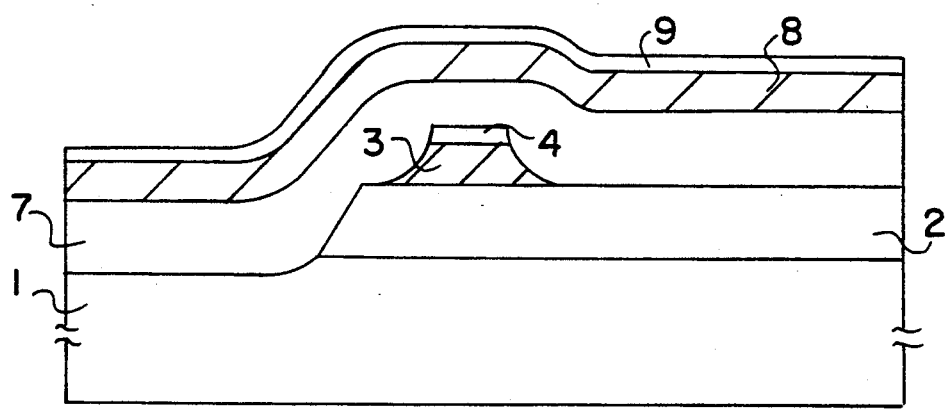
FIG. IE
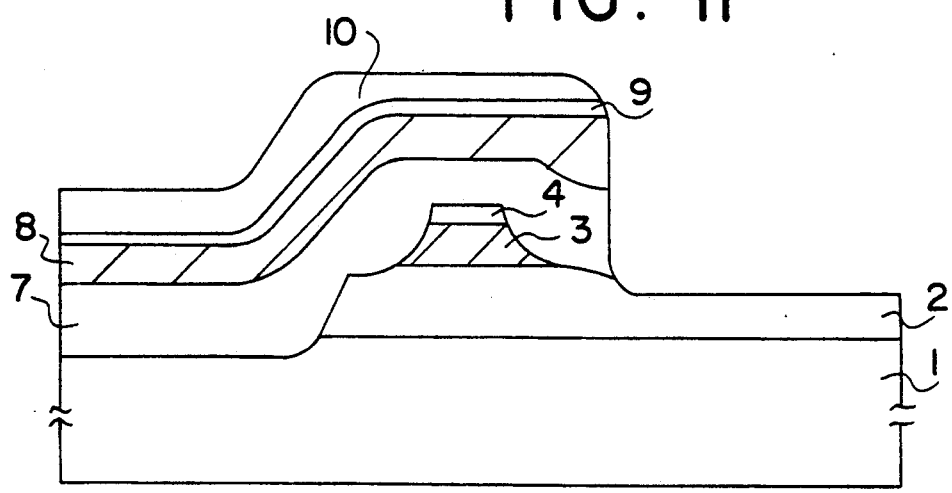
FIG. IF
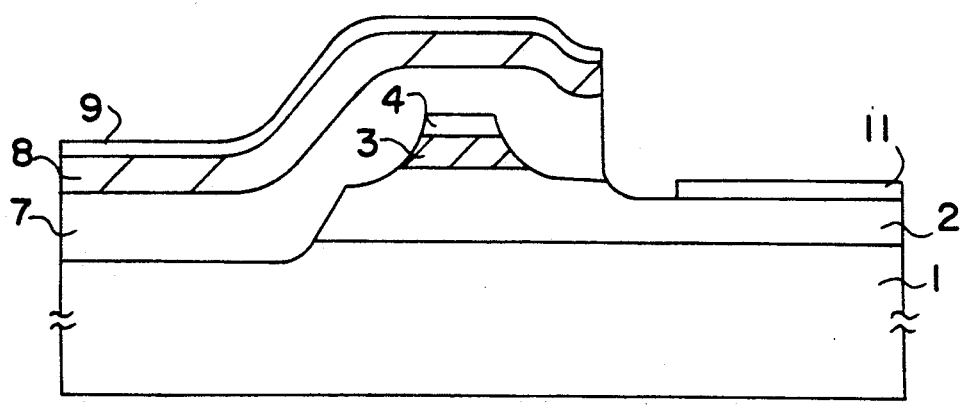
FIG. IG

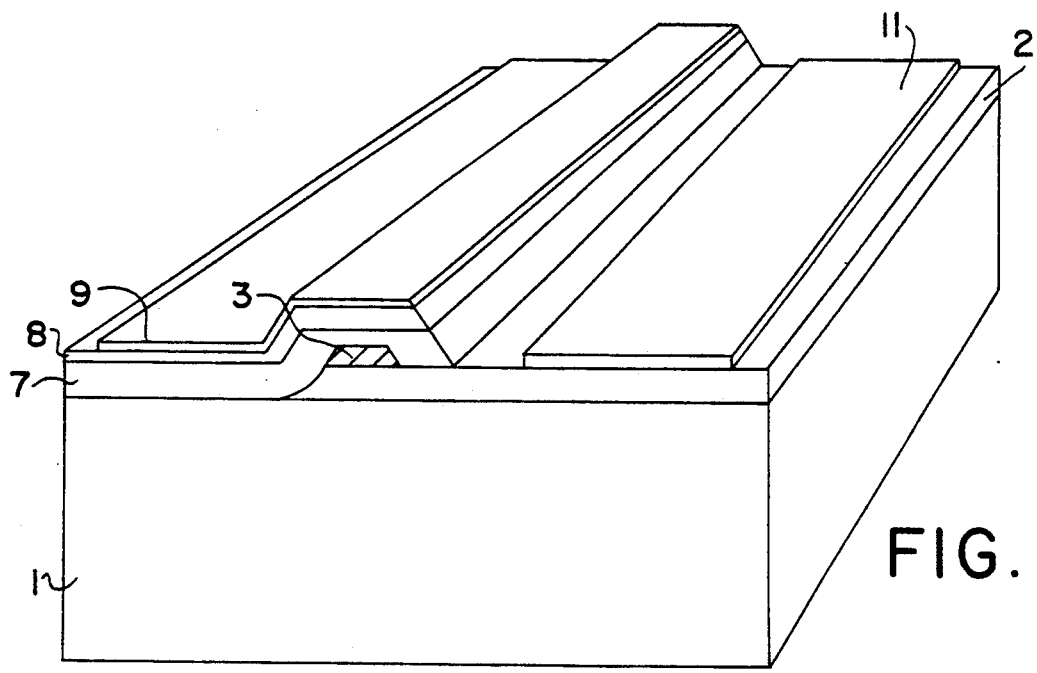
FIG. 2
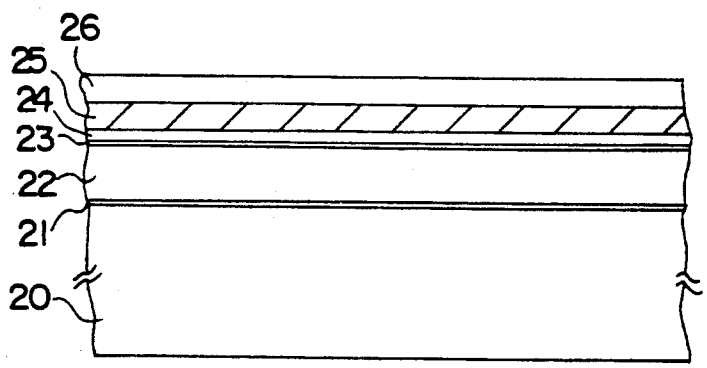
FIG. 3A
FIG. 3B
FIG. 3C
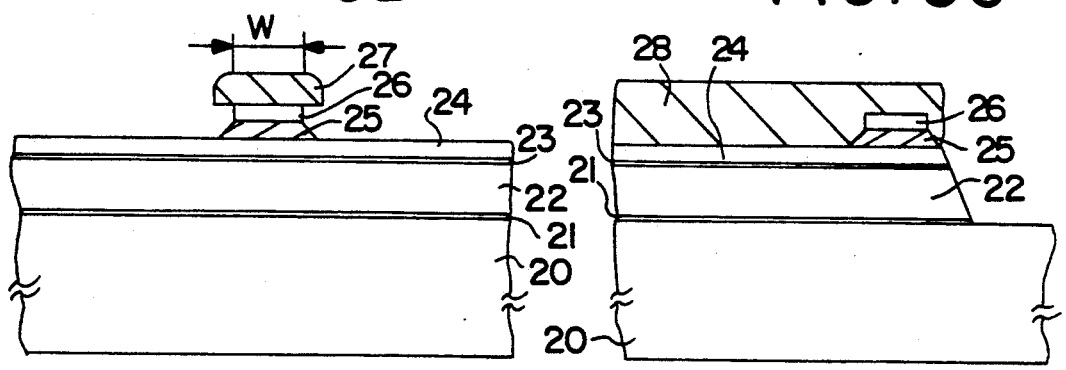

OPTOELECTRONIC DEVICE ON SEMI-INSULATOR SUBSTRATE AND METHODS FOR MAKING SUCH A DEVICE

BACKGROUND OF THE INVENTION

1. Field of the Invention

The present invention concerns an optoelectronic device on an semi-insulator substrate as well as various methods for making such a device.

2. Description of the Prior Art

At present, there is a growing interest in the transmission, by optical fibers, of very high frequency signals such as "radar" signals. Thus, it can be seen that there is a great demand for the development of optoelectronic devices by which the X band (8-12 GHz) or $K_U$ band (12-18 GHz) can be attained. At present, buried strip type lasers can be used to attain 10 GHz. Such lasers are constituted, for example, by a strip of active material provided between two confinement layers, namely a lower layer and an upper layer, each layer having a different type of conductivity, this entire unit being made on a semiconductor substrate. In fact, the limitation of these strips in frequency arises essentially out of the stray elements located on either side of the active strip, especially from the stray capacitances due to the P-N homojunction formed by the overlapping of the two confinement layers located on either side of the active strip.

The present invention is therefore aimed at achieving a notable reduction in this capacitance by proposing a new structure of an optoelectronic device made on a semi-insulator substrate.

SUMMARY OF THE INVENTION

Thus, an object of the present invention is an optoelectronic device on a semi-insulator substrate of the type comprising, stacked on one another, at least:
- one substrate made of semi-insulator material;
- one lower confinement layer with a first type of conductivity;
- at least one active layer in strip form;
- an upper confinement layer with a second type of conductivity;

wherein the lower confinement layer covers a side of the semi-insulator substrate in passing beneath the active layer and coming to a stop substantially vertically to this active layer and wherein the upper confinement layer covers the other side of the semi-insulator substrate in passing over the active layer and coming to a stop substantially vertically to this active layer, in leaving a P-N homojunction surface that is as small as possible (generally $< 1$ μm).

In this type of device, the N type confinement layer and the P type confinement layer, on either side of the confinement strip, are separated physically. As a consequence, a notable reduction is made in the surface of the P-N homojunction formed by the overlapping of the two layers and forming one of the preponderant stray elements restricting the frequency of the optoelectronic device.

According to one embodiment enabling efficient control of the structure of the active strip and of the confinement layers, the lower confinement layer is formed by the superimposition of a first chemical attack barrier layer, a confinement layer proper, a second chemical attack barrier layer and a layer made of a material identical to that of the confinement layer.

According to another embodiment that is simpler to implement, the lower confinement layer is formed by the superimposition of a chemical attack barrier layer and of the confinement layer proper.

The present invention also concerns various methods for the fabrication of an optoelectronic device such as the one described above.

According to a first method of fabrication, the optoelectronic device is obtained by the following implementation:
- a first step for the making, on a substrate made of semi-insulator material, of a lower confinement layer with a first type of conductivity, at least one active layer and an upper confinement layer with a second type of conductivity,
- etching of the upper confinement layer and of the active layer so as to make at least one strip of given width;
- etching of the lower confinement layer on a side of the substrate vertically to the strip;
- a second step for making a layer on the entire surface of the substrate, said layer being made of a same material as that of the upper confinement layer, and for making a contact layer;
- metallization of the contact layer,
- etching of the contact layer and of the layer made of the same material as the upper confinement layer, on the other side of the substrate, and substantially vertically to the strip, so as to bare the lower confinement layer not covered by the active layer, and
- making of a metallic contact on the lower confinement layer.

The present invention also concerns a second method for fabricating the above optoelectronic device, that enables more efficient control over the etching depths, leading to improved reproducibility of the structure.

This method comprises the following steps:
- a first step for the making, on a substrate made of semi-insulator material, of a first chemical attack barrier layer, a lower confinement layer with a first type of conductivity, a second chemical attack barrier layer, a layer made of a material identical to that of the lower confinement layer, an active layer and an upper confinement layer with a second type of conductivity,
- etching of the upper confinement layer and of the active layer so as to make at least one strip of determined width;
- etching, on a side of the substrate, vertically to the strip, of the layer made of a material identical to that of the lower confinement layer, of the second chemical attack barrier layer, the lower confinement layer and the first chemical attack barrier layer, this etching being made by using a sequence of selective chemical attacks;
- a second step for the making, on the entire surface of the substrate, of a layer made of a same material as the upper confinement layer, and for making a contact layer,
- metallization of the contact layer;
- etching of the contact layer and of the layer made of the same material as the upper confinement layer, on the other side of the substrate, and substantially vertically to the strip, so as to bare the lower confinement layer not covered by the active layer, this etching being done by ion machining of the metallization and of the contact layer, and by a sequence of selective attacks on the other layers, the making of a metal contact on the lower confinement layer.

The present invention also concerns a third method for the fabrication of an optoelectronic device which has the advantage of being easier to implement. This method comprises the following steps:

a first step for the making, on a substrate made of semi-insulator material, of a chemical attack barrier layer, a lower confinement layer with a first type of conductivity, at least one active layer and an upper confinement layer with a second type of conductivity;

etching of the upper confinement layer and of the active layer so as to make at least one strip of determined width and so as to keep the two layers on one side of the strip;

etching, on the other side and vertically to the strip, of the upper confinement layer and of the chemical attack barrier, said etching being made in using a sequence of selective chemical attacks on the two layers;

a second step for making a layer on the entire surface of the substrate, said layer being made of a same material as the upper confinement layer, and for making a contact layer;

metallization of the contact layer;

etching of the other side of the active strip so as to bare the lower confinement layer, and the making of a metallic contact on the lower confinement layer.

For example, the etching to bare the lower confinement layer is formed by an etching by ion machining of the metallization and of the contact layer, a selective chemical attack of the upper confinement layer and a selective chemical attack of the active layer that does not form the strip.

According to another characteristic of the present invention, the second step of fabrication consists no longer in depositing a layer made of a semiconductor material with the second type of conductivity but in depositing a layer made of a semi-insulator material and then in diffusing impurities with the second type of conductivity in this layer, on top of the strip.

In the above methods, the first and second steps for making the layers preferably use an epitaxy method.

BRIEF DESCRIPTION OF THE DRAWINGS

Other characteristics and advantages of the present invention will appear from the description of various non-restrictive embodiments, given here below with reference to the appended drawings, in which:

FIGS. 1A to 1G represent the different steps for making an optoelectronic device according to a first fabrication method according to the present invention;

FIG. 2 is a view in perspective of an optoelectronic device obtained according to the above method;

FIGS. 3A to 3E represent different steps in the fabrication of an optoelectronic device according to another fabrication method in accordance with the present invention;

DETAILED DESCRIPTION OF THE INVENTION

To simplify the description, in certain of the figures the same references designate the same references. Furthermore, the present invention shall be described with reference more particularly to buried strip lasers as a type of optoelectronic device in accordance with the present invention. However, it is clear to those skilled in the art that the present invention can be applied to any optoelectronic device comprising an active layer sandwiched between two confinement layers forming an N-P homojunction.

Furthermore, the present invention shall be described with reference to a semi-insulator substrate made of indium phosphide (InP) and to semiconductor materials such as the materials InP, GaInAsP or GaInAs. However, it is clear that the present invention can be applied to other groups of semiconductor materials, especially the group III and V compounds of the periodic classification of elements and their solid solutions such as GaAlAs, GaInAlAs, GaInAlSb etc.

In the same way, in the description the active strip is formed by a single layer. However, it is clear to those skilled in the art that the active strip can be formed by several sub-layers having different gaps so as to form a quantum well structure or else it may be formed by an active layer coated with a guiding layer made in the form of a distributed network to obtain a DFB (distributed feedback) laser.

Figure 1A:
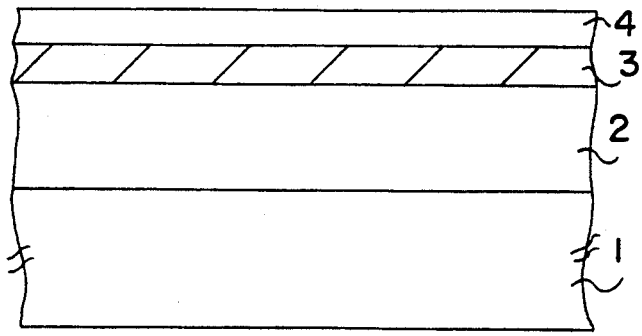

Referring now to FIGS. 1A to 1G, we shall now describe a first method for making a buried strip laser on a semi-insulator substrate in accordance with the present invention. As shown in FIG. 1A, a first epitaxy has been done on a semi-insulator substrate 1 of indium phosphide (InP) doped with impurities such as iron, cobalt or similar materials. This first epitaxy consists of a lower confinement layer 2 made of N type indium phosphide, an active layer 3 made of a semiconductor material chosen from among the ternary or quaternary compounds of the III and V groups of the periodic classification of elements and an upper confinement layer 4 made of P type indium phosphide. The epitaxy has been done in a known way by using an MOCVD type of chemical vapor deposition or a method of molecular beam epitaxy (MBE). Besides, it is also clear to those skilled in the art that the optoelectronic device can also be made with a P type lower confinement layer and an N type upper confinement layer.

Figure 1B:
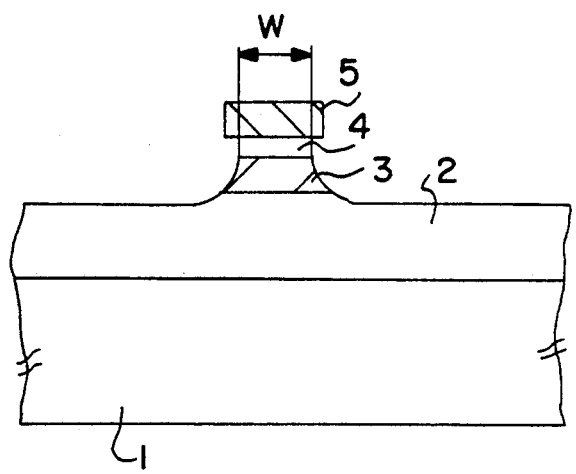

As can be seen in FIG. 1B, after a resin strip 5 has been deposited on the part to be protected, the upper confinement layer 4 and the active layer 3 are etched so as to obtain an active strip with a width W. This etching is done to a depth that corresponds substantially to the thickness of the layer 4 and of the layer 3. The etching used is a known type of chemical etching.

Figure 1C:
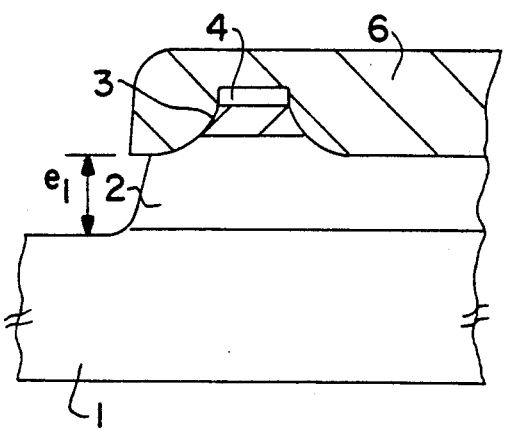
Figure 1D:
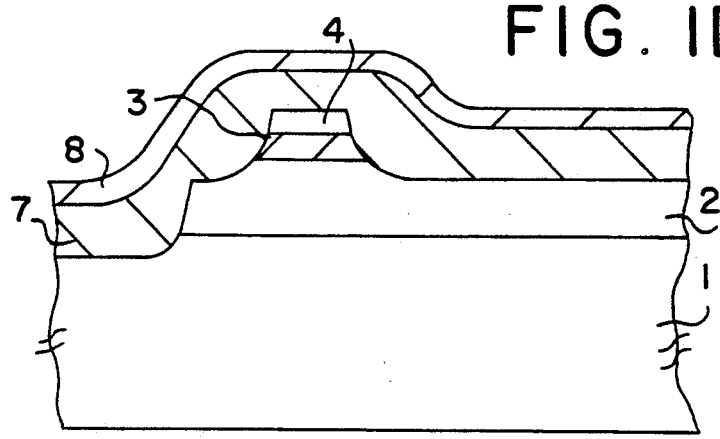

As shown in FIG. 1C, after covering half of the substrate and the strip formed by the layers 3 and 4 with a resin layer 6, a second etching is done. This etching is done on the left-hand side of the substrate in the fabrication method shown, almost vertically to the strip formed by the layers 4 and 3. This etching attacks chiefly the lower confinement layer 2 and it is made on a thickness e1 corresponding substantially to the thickness of the lower confinement layer 2 so as to bare the substrate 1. Then, as shown in FIG. 1D, a layer 7 is deposited by epitaxy throughout the width of the device. This layer 7 is made of P type indium phosphide, i.e. of the same material as the upper confinement layer 4. On this layer 7, a contact layer 8 is deposited. This contact layer is made of a P++ type ternary compound such as GaInAs. On this layer 8, a metal layer 9 is deposited. This metal layer 9 is formed, for example, by a double layer of platinum and gold, as shown in FIG. 1E.

Then, as shown in FIG. 1F, a resin layer 10 is deposited on the first side of the substrate, namely on the left-hand side in the embodiment shown. This resin layer 10 extends so as to cover the active strip formed by the layer 3 and so as to stop substantially vertically to this active strip. Then, in using firstly an ion machining, then a chemical etching, all the layers 9, 8 and 7 are etched so as to bare the lower confinement layer 2. Then, as shown in FIG. 1G, an ohmic contact is deposited on this lower confinement layer 2. This ohmic contact layer is formed by a gold layer 11. Thus, it has been possible to make a buried strip laser on a semi-insulator substrate as shown in perspective in FIG. 2. As can be seen clearly in FIGS. 1G or 2, in this case a major reduction is made in the contact surface between the lower confinement layer 2 and the upper confinement layer 7. Hence, a notable reduction is made in the P-N homojunction, namely the stray capacitance formed by this homojunction. This homojunction may have a dimension smaller than 1 μm.

Thus, by using this method, it has been possible to make lasers working at more than 10 GHz with a power of 3 mW and for a length of more than 300 μm.

With reference to FIGS. 3A to 3E, we shall now describe another method of fabrication of a laser on a semi-insulator substrate that can be used to overcome the problems encountered with standard chemical etchings. For, such etchings do not enable efficient control over both the depth of the etchings and their homogeneity.

As shown in FIG. 3A, in the case of the new method, a first chemical attack barrier layer 21 has been made by epitaxy on a semi-insulator substrate 20 constituted by indium phosphide InP doped with iron and cobalt. The thickness of the layer 21 may be very small, for example of the order of 100 Å. On this layer 21, the following have been deposited by epitaxy: a lower confinement layer 22 made of N++ type indium phosphide, a second chemical attack barrier layer 23 with a very small thickness, for example of the order of 100 Å, and a layer 24 of the same material as the lower confinement layer, i.e. N++ type InP, an active layer 25 and an upper confinement layer 26 made of P type InP. In the embodiment shown, the chemical attack barrier layer as well as the active layer are formed by quaternary components such as GaInAsP. In the context of the present invention, these layers may also be formed by ternary compounds.

Then, as shown in FIG. 3B, after a resin strip 27 is deposited, the active strip is etched by etching the layers 26 and 25 by means of a solution of selective attacks on the InP layer and then on the layer made of quaternary compounds so as to obtain a strip of a width W on a depth equal to the depth of the two layers 26 and 25. Then, as shown in FIG. 3C, a resin layer 28 is deposited on one side of the substrate, namely the left-hand side in the embodiment shown, so as to cover the strip formed by the layers 25 and 26. Then a second etching is done on the right-hand side of the substrate so a to bare the substrate 20. This etching is a chemical etching that achieves selective InP/quaternary attacks.

Figure 3D:
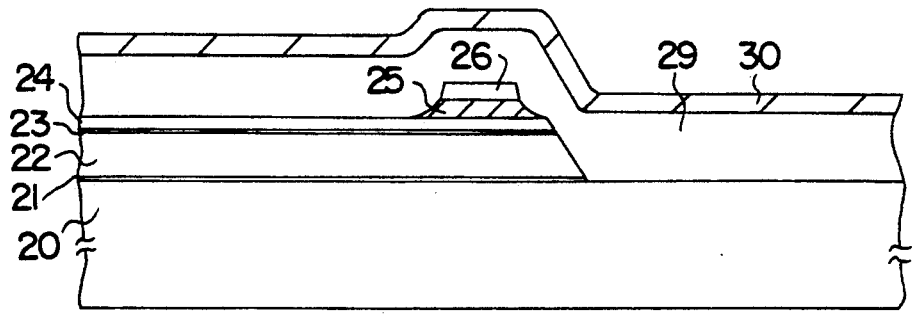
Figure 3E:
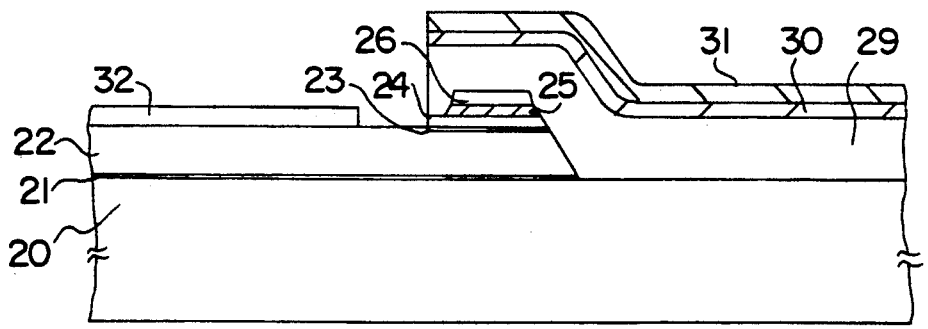

Then, as shown in FIG. 3D, a layer 29 and a contact layer 30 are deposited by epitaxy on the structure thus obtained. The layer 29 is made of the same material as the confinement layer 26, i.e. P type InP. The contact layer 30 is made with ternary compounds such as P++ type GaInAs. The contact layer 30 is metallized by deposition of a layer of platinum and a layer of gold 31. Then, on the other side of the active strip 25, 26, namely on the left-hand side in the fabrication method shown, an etching is done so as to bare the lower confinement layer 22. This etching is formed, first of all, by an ion machining of the layers 31 and 30, and then by a chemical etching with selective attack on the InP and quaternary compounds of the layers 29, 24 and 23. Then, on the lower confinement layer 22, an N type contact layer 32 is deposited. Thus, with this method, there is obtained a restriction of the surface of the P-N homojunction to a value of about 1 μm.

This new method enables more efficient control over the depths of the etchings as well as their homogeneity. This results in a more efficient reproducibility of the structure. However, this method calls for a first epitaxy comprising numerous layers. Furthermore, it is difficult to achieve exact control over the precision of the etching mask of the P type layers. Therefore, a new method is proposed here below for the fabrication of buried strip lasers on semi-insulator substrate enabling some of the above problems to be partially solved.

Figure 4A:
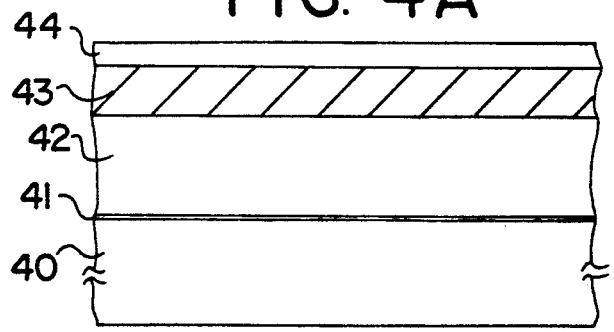
FIGS. 4A to 4E represent the different steps in the fabrication of an optoelectronic device according to yet another method in accordance with the present invention.
Figure 4B:
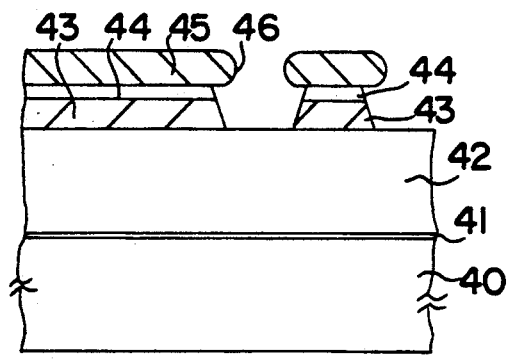
Figure 4C:
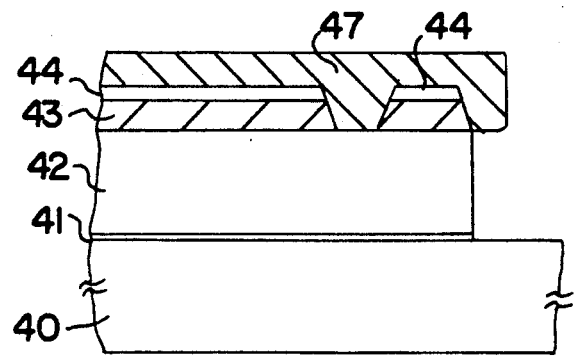
Figure 4D:
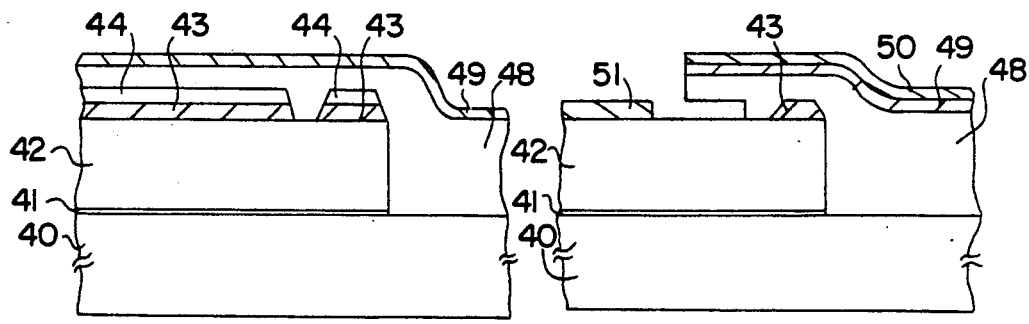
Figure 4E:
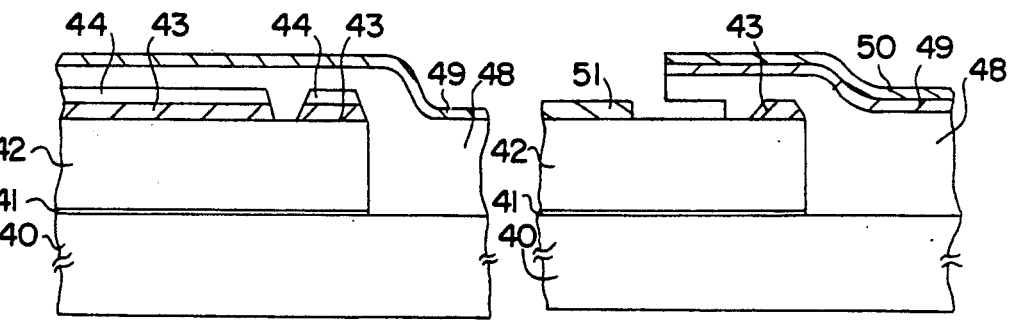

As shown in FIG. 4A, the following are epitaxially grown on a semi-insulator substrate 40: a quaternary compound based chemical attack barrier layer 41 with a thickness which may be of the order of 100 Å, a lower confinement layer made of N++ doped InP, a quaternary compound based active layer 43 and an upper confinement layer 44 made of P doped InP. As shown in FIG. 4B, half of the surface of the device, namely the left-hand part of the drawings, is covered with a resin layer 45 as well as a resin strip 45' so as to leave a groove 46 between the two that has a width of less than 1 μm. Once the resin is deposited, the layers 43 and 44, unprotected by the resin, are etched by chemical attack so as to obtain the active strip as well as a part of the layers 44 and 43 beyond the groove 46. The etchings used in this case are selective etchings of InP and then of the quaternary compounds. Then, as shown in FIG. 4C, the remaining layers 44 are covered with a resin layer 47 and, on the other side of the active strip 43, 44, vertically to this strip, a selective etching of InP and quaternary compounds is done so as to bare the substrate 40. Then, as shown in FIG. 4D, the following are deposited by epitaxy on the entire device: a layer 48 made of a same material as the confinement layer 44 (i.e. made of P type indium phosphide) and a contact layer 49 made of ternary compounds such as P++ type GaInAs. As shown in FIG. 4E, metallic layers 50 of platinum and gold are deposited on this layer 49. Then, on the other side, namely on the left-hand side of FIG. 4E, firstly an ion etching of the layers 50 and 49 is done, then a selective chemical etching is done to etch the layers 48, 44 and 43 so as to bare the lower confinement layer 42. In this case, a sub-etching is done of the layer 43 that does not form the active strip. Then, as shown in FIG. 4E, an ohmic contact is deposited on the lower confinement layer 42, for example an N type contact 51.

In fact, this manner of using the sub-etching of the layer 43 made of quaternary compounds enables a structure where the alignment is far less vitally important than previously since the width of the P-N homojunction is defined by the width of the etching made before the resumption of epitaxy. This width may be smaller than 1 μm.

Figure 5:
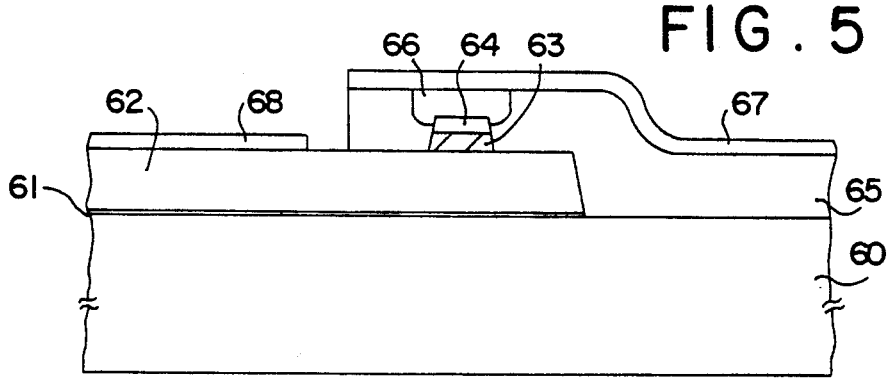
FIG. 5 represents a sectional view of an optoelectronic device obtained by an alternative embodiment according to the present invention.

With reference to FIG. 5, we shall now describe another method of fabrication of a buried strip laser on a semi-insulator substrate In this case, the method used is identical to the one described with reference to FIG. 3. During the second epitaxial operation, instead of depositing a layer of P type indium phosphide, a semi-insulator layer is deposited, namely, in the embodiment shown, a layer of indium phosphide doped with iron. Then, on top of the layers 63 and 64 forming the active strip, a P type diffusion is made, for example a diffusion of zinc, through a diffusion mask. This diffusion is done up to the level of the upper confinement layer 64 located above the active layer 63 and achieved during the first epitaxy. In this case, the P-N homojunction is eliminated. There is no longer any leakage current or stray capacitance. In the same way, the dimensions of the etchings located on either side of the active strip as well as the precision of alignment become less vitally important. Consequently, the use of this layer may be implemented with the method of FIGS. 1 as well as with the method of FIGS. 3. The laser thus obtained is therefore formed by a semi-insulator substrate 60, a chemical attack barrier layer 61, a lower confinement layer 62 extending on one side of the substrate 60, an active strip 63, an upper confinement layer 64, a layer of a semi-insulator material 65 extending on the other side of the substrate and covering the active strip with a contact layer 67, the impurity diffusion zone 66 and a contact 68 deposited on the confinement layer 62.

Figure 6:
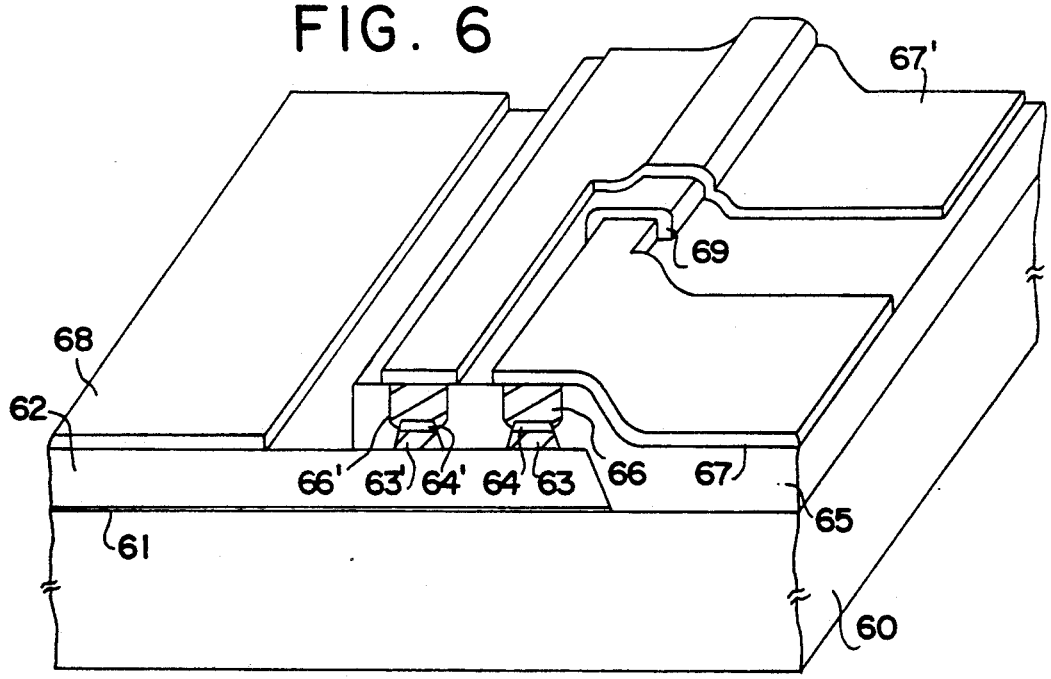
FIG. 6 is a view in perspective of an optoelectronic device according to the present invention.

The use of diffusions makes it easy to integrate several optoelectronic devices of the buried strip type on one and the same semi-insulator substrate. One method of achieving the integration of two lasers with separate controls has been shown by way of example in FIG. 6. This device has been made by using the method of FIG. 5. Hence, the same elements bear the same references. Using the method of FIG. 5, two active strips 63, 63' have been made, each covered with an upper confinement zone 64, 64' made of P type InP in a known way. On this zone, and after a semi-insulator layer 65 has been deposited and etched, two diffusions 66', 66 have been made throughout the length of the device. These diffusions are covered with contact layers 67, 67'. To prevent contact between the metallization 67 and the metallization 67', a dielectric layer 69 is deposited on a part of the contact 67. It is clear to those skilled in the art that the same method can be used to integrate other optoelectronic devices.

What is claimed is:

1. An optoelectronic device, on a semi-insulator substrate, comprising, stacked on one another, at least:
   one substrate made of semi-insulator material;
   one lower confinement layer with a first type of conductivity;
   at least one active layer having a width narrower than the width of the substrate to be in strip form;
   an upper confinement lever with a second type of conductivity;
   wherein the lower confinement layer covers one side of the semi-insulator substrate in passing beneath the active layer and coming to a stop substantially vertically to this active layer and wherein the upper confinement layer covers the other side of the semi-insulator substrate in passing over the active layer and coming to a stop substantially vertically to this active layer, further comprising a first chemical attack barrier layer, between the lower confinement layer and the substrate, and a second chemical attack barrier layer separating the lower confinement layer into two layers and in a plane parallel to the first chemical attack barrier layer.

2. An optoelectronic device on a semi-insulator substrate, comprising, stacked on one another, at least:
   one substrate made of semi-insulator material;
   one lower confinement layer with a first type of conductivity;
   at least one active layer having a width narrower than the width of the substrate to be in strip form;
   an upper confinement layer with a second type of conductivity;
   wherein the lower confinement layer covers one side of the semi-insulator substrate in passing beneath the active layer and coming to a stop substantially vertically to this active layer and wherein the upper confinement layer covers the other side of the semi-insulator substrate in passing over the active layer and coming to a stop substantially vertically to this active layer, a chemical attack barrier layer adjacent the lower confinement layer, wherein the chemical attack barrier layer is made of an N+ doped semiconductor material.

3. A device according to claim 2, wherein the semiconductor materials are compounds of the III and V groups of the periodic classification of elements.

4. A device according to claim 3, wherein the lower and upper confinement layers are made with binary compounds.

5. A device according to claim 3, wherein the chemical attack barrier layers are made with quaternary or ternary compounds.

6. A device according to claim 3, wherein the active layer is made with quaternary or ternary compounds.

* * * * *